US008787030B2

(12) United States Patent
Oikawa

(10) Patent No.: US 8,787,030 B2
(45) Date of Patent: Jul. 22, 2014

(54) MULTILAYER CIRCUIT BOARD WITH RESIN BASES AND SEPARATORS

(75) Inventor: Akira Oikawa, Tokyo (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 455 days.

(21) Appl. No.: 13/124,751

(22) PCT Filed: Oct. 28, 2009

(86) PCT No.: PCT/JP2009/005684
§ 371 (c)(1),
(2), (4) Date: Apr. 18, 2011

(87) PCT Pub. No.: WO2010/050193
PCT Pub. Date: May 16, 2010

(65) Prior Publication Data
US 2011/0211321 A1 Sep. 1, 2011

(30) Foreign Application Priority Data

Oct. 30, 2008 (JP) ................. P2008-279732

(51) Int. Cl.
*H05K 7/00* (2006.01)
(52) U.S. Cl.
USPC .......................................... 361/782; 361/762
(58) Field of Classification Search
USPC .................. 361/782, 760–763; 174/250–260, 174/262–266
See application file for complete search history.

(56) References Cited

U.S. PATENT DOCUMENTS

| 6,872,893 | B2 | 3/2005 | Fukuoka et al. |
| 2002/0179329 | A1 | 12/2002 | Fukuoka et al. |
| 2005/0126820 | A1 | 6/2005 | Fukuoka et al. |
| 2005/0155792 | A1 | 7/2005 | Ito et al. |
| 2006/0254050 | A1 | 11/2006 | Fukuoka et al. |

FOREIGN PATENT DOCUMENTS

| JP | 11-54934 A | 2/1999 |
| JP | 2003-218532 A | 7/2003 |
| JP | 2004-31803 A | 1/2004 |
| JP | 2004-186433 A | 7/2004 |
| JP | 2005-340577 A | 12/2005 |
| JP | 2006-102753 A | 4/2006 |
| JP | 2007-96121 A | 4/2007 |
| JP | 2005-353868 A | 7/2007 |
| JP | 2007-184388 A | 7/2007 |
| JP | 2007-184631 A | 7/2007 |
| JP | 2008-103640 A | 5/2008 |

OTHER PUBLICATIONS

International Search Report dated Jan. 12, 2010 in International Application No. PCT/JP2009/005684.

*Primary Examiner* — Tremesha S Willis
(74) *Attorney, Agent, or Firm* — Global IP Counselors, LLP

(57) ABSTRACT

A multilayer circuit board (1) includes resin bases ($10_1$ to $10_N$) stacked while placing separators ($12_1$ to $12_{N-1}$) in between, interconnect patterns ($11_1$ to $11_N$) respectively formed on one surface of each of the resin bases ($10_1$ to $10_N$), and electro-conductive bumps ($20_1$ to $20_{N-1}$) which electrically connect the interconnect patterns ($11_1$ to $11_N$). The resin bases ($10_1$ to $10_N$) and the separators ($12_1$ to $12_{N-1}$) are heat-bonded, the separators ($12_1$ to $12_{N-1}$) are composed of a first thermoplastic resin material having a first glass transition temperature, and the resin bases ($10_1$ to $10_N$) are composed of a second thermoplastic resin material having a second glass transition temperature higher than the first glass transition temperature.

12 Claims, 7 Drawing Sheets

(A)

(B)

MULTILAYER CIRCUIT BOARD WITH RESIN BASES AND SEPARATORS

TECHNICAL FIELD

The present invention relates to a multilayer circuit board, which is a stacked article of a plurality of resin bases, and a method of manufacturing the same, and in particular to a multilayer circuit board, which is a stacked article of a plurality of resin bases, each having an interconnect pattern which composes a passive element, and a method of manufacturing the same.

BACKGROUND ART

With recent trends towards higher density of integration of electronic instruments, a need has arisen for flexible circuit board having passive elements (inductor and coil antenna, for example) densely mounted thereon. Higher density of integration on the flexible circuit board may be embodied by stacking a plurality of resin bases, each having an interconnect pattern formed on one surface thereof, while placing an adhesive layer in between to thereby form a multilayer structure, typically as described in Patent Document 1 (Japanese Laid-Open Patent Publication No. H11-54934).

Prior art documents regarding the multilayer structure, besides Patent Document 1, may be exemplified by Patent Document 2 (Japanese Laid-Open Patent Publication No. 2008-103640) and Patent Document 3 (Japanese Laid-Open Patent Publication No. 2007-096121). The multilayer structure disclosed in Patent Document 2 has a structure in which circuit boards each having an interconnect pattern (electro-conductive pattern) and multilayer resin layers are alternately stacked, and each multilayer resin layer contains a first layer composed of a thermoplastic resin, a second layer composed of a thermosetting resin, and a connective conductor extended through the first layer and the second layer.

On the other hand, Patent Document 3 discloses a circuit board configured by an insulating base, having a conductor pattern formed on the surface thereof and composed of a thermoplastic resin, and an electro-conductive paste filled in via holes formed to extend through the insulating base. The multilayer structure disclosed in Patent Document 3 is configured by collectively or sequentially stacking a plurality of such circuit boards by heat bonding.

[Patent Document 1] Japanese Laid-Open Patent Publication No. H11-54934
[Patent Document 2] Japanese Laid-Open Patent Publication No. 2008-103640
[Patent Document 3] Japanese Laid-Open Patent Publication No. 2007-096121

DISCLOSURE OF THE INVENTION

In order to form passive elements suitable for high-frequency devices into the multilayer structure, it is important to suppress energy loss ascribable to dielectric materials to a low level. Since the energy loss (dielectric loss) is proportional to the product of loss tangent (tan δ) and dielectric constant (∈), so that it is preferable that both of loss tangent and dielectric constant, and additionally moisture absorption ratio, are small. While the multilayer structure making use of the adhesive layers is disclosed in Patent Document 1 as described in the above, the multilayer structure is not understood as being suitable for high-frequency devices due to large loss tangent of the adhesive layers.

One possible method of embodying small loss tangent, small dielectric constant and small moisture absorption ratio relates to use of organic resin materials such as thermoplastic resin as materials for composing the multilayer structure. As disclosed in Patent Document 3, the multilayer structure may be manufactured by heat-bonding, and thereby integrating, a plurality of thermoplastic resin bases each having an interconnect pattern formed on the surface thereof. The passive elements (inductor, coil antenna and so forth) for high-frequency devices may be formed in the multilayer structure, by appropriately selecting geometry and combination of the interconnect patterns. The interconnect patterns formed on the thermoplastic resin bases may, however, deform due to melting or softening of the thermoplastic resin bases in the process of heat bonding. In this case, a large degree of deformation of the interconnect patterns may result in short-circuiting of the adjacent interconnect patterns, or undesirable formation of passive elements causative of malfunction.

Considering the above-described situation, it is therefore an object of the present invention to provide a multilayer circuit board which has expressing excellent electrical characteristics in high-frequency range, and includes interconnect patterns capable of ensuring a good geometrical accuracy.

According to the present invention, there is provided a multilayer circuit board which includes: a plurality of resin bases stacked while respectively placing a separator in between; a plurality of interconnect patterns formed on one surface of each of the plurality of resin bases; and electro-conductive bumps which are formed to extend through the resin bases and the separators, so as to electrically connect the plurality of interconnect patterns. The resin bases and the separators are heat-bonded. The separators are composed of a first thermoplastic resin material having a first glass transition temperature. Each of the resin bases is composed of a second thermoplastic resin material having a second glass transition temperature higher than the first glass transition temperature.

According to the present invention, there is also provided a method of manufacturing a multilayer circuit board, which includes: a step of forming, and thereby embedding, electro-conductive bumps respectively in (N−1) resin bases out of N resin bases (N is an integer of 2 or larger); a step of forming an interconnect pattern respectively on one surface of each of the N resin bases; a step of arranging the N resin bases by stacking them while respectively placing a separator in between, and while placing the resin base having no electro-conductive bumps, out of the N resin bases, outermostly; and a step of electrically connecting said plurality of interconnect patterns through said electro-conductive bumps, by heat-bonding, and thereby integrating, of said N resin bases and said separators after said N resin bases are stacked while placing said separators in between. The separator is composed of a first thermoplastic resin material having a first glass transition temperature. Each of the resin bases is composed of a second thermoplastic resin material having a second glass transition temperature higher than the first glass transition temperature. In the step of heat-bonding of the N resin bases and the separators, the N resin bases and the separators are heat-bonded at a temperature higher than the first glass transition temperature, and lower than the second glass transition temperature.

As described in the above, the multilayer circuit board of the present invention has a multilayer structure composed of a plurality of resin bases having the interconnect patterns formed on the surfaces thereof, and separators, which are heat-bonded with each other. Since the glass transition temperature of the thermoplastic resin, which is a material for composing the resin bases, is higher than the glass transition temperature of the thermoplastic resin, which is a material for composing the separators, so that the multilayer circuit board of the present invention is given a structure capable of preventing any geometrical deformation of the interconnect patterns on the resin bases, as a result of heat bonding between the resin bases and the separators proceeded at a temperature not causative of melting nor softening of the resin bases but contributive to melting or softening of the separators. Accordingly, the present invention may successfully provide a multilayer circuit board which has expressing excellent electrical characteristics (small dielectric constant and small dielectric loss) in high-frequency range, and includes the interconnect patterns capable of ensuring a good geometrical accuracy.

According to the method of manufacturing a multilayer circuit board of the present invention, since a plurality of resin bases having the interconnect patterns formed on the surfaces thereof and the separators may be heat-bonded at a temperature higher than the glass transition temperature of the separators (first glass transition temperature) and lower than the glass transition temperature of the resin bases (second glass transition temperature), so that the separators may be melted or softened without melting nor softening the resin bases. As a consequence, the present invention may successfully manufacture a multilayer circuit board which has expressing excellent electrical characteristics (small dielectric constant and small dielectric loss) in high-frequency range, and includes the interconnect patterns capable of ensuring a good geometrical accuracy.

BRIEF DESCRIPTION OF THE DRAWINGS

The above and other objects, features and advantages of the present invention will be more apparent from the following description of certain preferred embodiments taken in conjunction with the accompanying drawings.

BEST MODES FOR CARRYING OUT THE INVENTION

Embodiments of the present invention will be explained below, referring to the attached drawings.
(First Embodiments)

Figure 1:
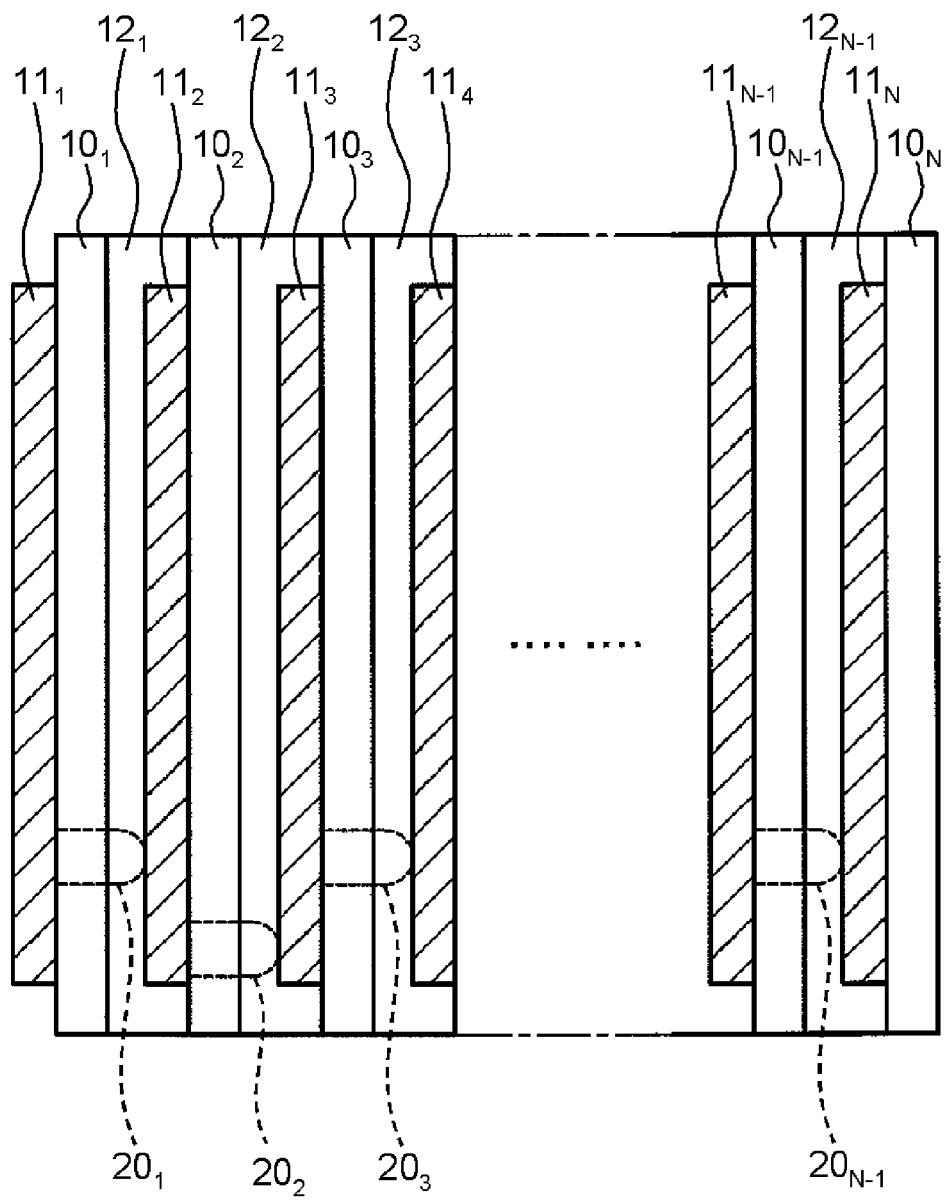
FIG. 1 is a drawing schematically illustrating a stacked structure of the multilayer circuit board according to a first embodiment of the present invention.

FIG. 1 is a drawing schematically illustrating a stacked structure of a multilayer circuit board 1 according to the first embodiment of the present invention. As illustrated in FIG. 1, the multilayer circuit board 1 contains resin bases $10_1$, ..., $10_N$ stacked while placing separators $12_1$, ..., $12_{N-1}$ in between, interconnect patterns $11_1$, ..., $11_N$ respectively formed on one surface of each of the resin bases $10_1$, ..., $10_N$, and electro-conductive bumps $20_1$, $20_2$, ..., $20_{N-1}$ which electrically connect the interconnect patterns $11_1$ to $11_N$.

The electro-conductive bumps $20_1$ to $20_{N-1}$ are formed to extend through the resin bases $10_1$ to $10_{N-1}$ and the separators $12_1$ to $12_{N-1}$. In other words, the electro-conductive bump $20_k$ (k represents any one of 1 to N–1) between every adjacent interconnect patterns $11_k$, $11_{k+1}$ is formed to protrude from one interconnect pattern $11_k$ towards the other interconnect pattern $11_{k+1}$.

Materials for composing the electro-conductive bumps $20_1$ to $20_{N-1}$ may be one or more species of metal materials selected from the group consisting of gold, silver, nickel, tin, lead, zinc, bismuth, antimony and copper.

High-frequency passive elements may be configured by the interconnect patterns $11_1$ to $11_N$ and the electro-conductive bumps $20_1$ to $20_{N-1}$. The high-frequency passive elements may be exemplified by resistor, inductor, capacitor, coil antenna, and combinations of these elements.

The separators $12_1$ to $12_{N-1}$ are composed of a thermoplastic resin material, and also the resin bases $10_1$ to $10_N$ are composed of a thermoplastic resin material. The thermoplastic resin material composing the resin bases $10_1$ to $10_N$ has glass transition temperature Tg2 which is higher than glass transition temperature Tg1 of the thermoplastic resin material composing the separators $12_1$ to $12_{N-1}$. By bonding the resin bases $10_1$ to $10_N$ and the separators $12_1$ to $12_{N-1}$ under heating in a temperature range higher than Tg1 and lower than Tg2, the multilayer circuit board 1 may be manufactured. In other words, by bonding, and thereby integrating the resin bases $10_1$ to $10_N$ and the separators $12_1$ to $12_{N-1}$ under heating at a temperature not causative of melting nor softening of the resin bases $10_1$ to $10_N$, but contributive to melting or softening of the separators $12_1$ to $12_{N-1}$, the interconnect patterns $11_1$ to $11_N$ on the resin bases $10_1$ to $10_N$ may be prevented from being geometrically deformed in the process of heat bonding.

The thermoplastic resin material composing the resin bases $10_1$ to $10_N$ and the thermoplastic resin material composing the separators $12_1$ to $12_{N-1}$ are respectively configured by cyclic olefinic resin compositions having different glass transition temperatures Tg2, Tg1, as their major constituents. The cyclic olefinic resin contains a (co)polymer of cyclic olefinic monomers as a major constituent. A desired glass transition temperatures Tg2, Tg1 may be obtained by varying polymerization conditions to thereby control molecular weight and density of crosslinkage of the cyclic olefinic resin. The glass transition temperatures Tg2, Tg1 may be elevated by increasing the degree of polymerization, or by elongating side chains of the cyclic olefinic resin.

In view of obtaining excellent electrical characteristics (small dissipation factor, small dielectric constant) in high-frequency range, norbornene resin is particularly preferably out of cyclic olefinic resin compositions. The norbornene resin may achieve electric characteristics represented by a dielectric constant of approximately 2, and a dissipation factor on the order of $10^{-3}$ to $10^{-4}$ at 10 GHz. Examples of the norbornene resin, having electrical characteristics represented by a dielectric constant of approximately 2, and a dissipation factor on the order of $10^{-4}$ at 10 GHz, include "TOPAS8007" (glass transition temperature=78° C.), "TOPAS6013" (glass transition temperature=138° C.), "TOPAS6015" (glass transition temperature=158° C.), "TOPAS5013" (glass transition temperature=134° C.), and "TOPAS6017" (glass transition temperature=178° C.), all of which are commercially available from Ticona.

In view of allowing the separators $12_1$ to $12_{N-1}$ to cause melting or softening in the process of heat bonding, without causing melting nor softening of the resin bases $10_1$ to $10_N$, difference of the glass transition temperatures (=Tg2−Tg1) between the resin base $10_1$ to $10_N$ and the separators $12_1$ to $12_{N-1}$ is preferably 50° C. or around. Combinations of the resin bases $10_1$ to $10_N$ and the separators $12_1$ to $12_{N-1}$ may be exemplified by "TOPAS5013" and "TOPAS8007", while not being limited thereto.

Next, a preferable process of manufacturing the multilayer circuit board 1 will be explained.

First, a copper foil is formed on one surface of each of N resin bases $10_1$ to $10_N$. Next, electro-conductive bumps $20_1$ to $20_{N-1}$ are formed, and thereby embedded, in the resin bases $10_1$ to $10_{N-1}$ out of N resin bases $10_1$ to $10_N$. More specifically, through-holes which are bottomed on the copper foils are bored from the opposite surfaces of the resin bases $10_1$ to $10_{N-1}$. Then, electro-conductive projections are formed in the through-holes so as to project out therefrom, by electrolytic plating or paste printing. The electro-conductive projections may be configured by copper, for example. Highly accurate through-holes may readily be formed in the resin bases $10_1$ to $10_{N-1}$ by laser microfabrication. Next, the exposed surfaces of the electro-conductive projections are covered with a metal or alloy. The metal may be composed of at least one species selected from the group consisting of gold, silver, nickel, tin, lead, zinc, bismuth and antimony, and may be composed of a single layer, or two or more layers. The alloy may be exemplified by solders composed of at least two or more species of metals selected from the group consisting of tin, lead, silver, zinc, bismuth, antimony and copper. The solders may be exemplified by those of tin-lead-base, tin-silver-base, tin-zinc-base, tin-bismuth-base, tin-antimony-base, tin-silver-bismuth-base, and tin-copper-base, while being not limited thereto, and allowing selection of most suitable one. Of course, the metals and alloys enumerated in the above have melting points sufficiently higher than the glass transition temperatures of the resin bases $10_1$ to $10_N$ or the separators $12_1$ to $12_{N-1}$, and do not melt in the process of heat bonding.

Next, the interconnect patterns $11_1$ to $11_N$ are formed by etching the copper foils formed on N resin bases $10_1$ to $10_N$. The interconnect patterns $11_1$ to $11_N$ are typically such as those preliminarily designed to configure high-frequency passive elements such as inductor, resistor, capacitor or matching circuit. At least a part of the interconnect patterns $11_1$ to $11_N$ formed in this process may preferably be a spiral interconnect pattern having an angle of turn exceeding 360°, detail of which will be described later.

Figure 2:
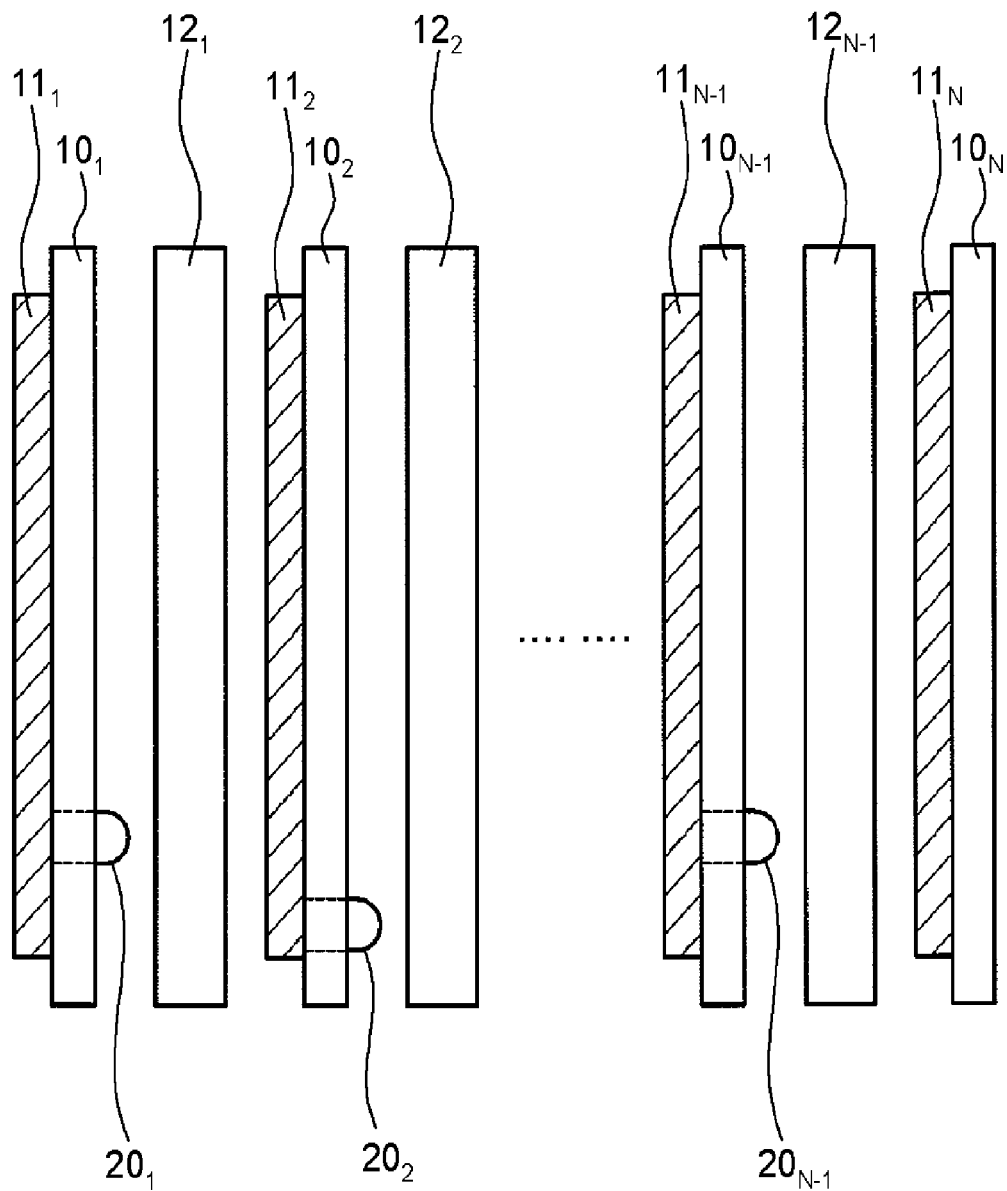
FIG. 2 is a drawing for explaining a method of manufacturing the multilayer circuit board of the first embodiment.

Next, as illustrated in FIG. 2, the resin bases $10_1, \ldots, 10_N$ are stacked while placing the separators $12_1, \ldots, 12_{N-1}$ in between, in a molding machine. In this process, the resin bases $10_1$ to $10_N$ are arranged so as to direct all of the interconnect patterns $11_1$ to $11_N$ in the same direction, while placing the resin base $10_N$, having no electro-conductive bump formed thereon, outermostly.

Next, the resin bases $10_1$ to $10_N$ and the separators $12_1$ to $12_{N-1}$, disposed in the molding machine, are pressed under heating in a temperature range higher than the glass transition temperature Tg1 of the separators $12_1$ to $12_{N-1}$, and lower than the glass transition temperature Tg2 of the resin bases $10_1$ to $10_N$. By the heating, the resin bases $10_1$ to $10_N$ and the separators $12_1$ to $12_{N-1}$ are heat-bonded. The electro-conductive bumps $20_1, \ldots, 20_{N-1}$ extend through the melted or softened separators $12_1, \ldots, 12_{N-1}$, and are bonded to the surfaces of the interconnect patterns $11_2, \ldots, 11_N$.

Figure 3:
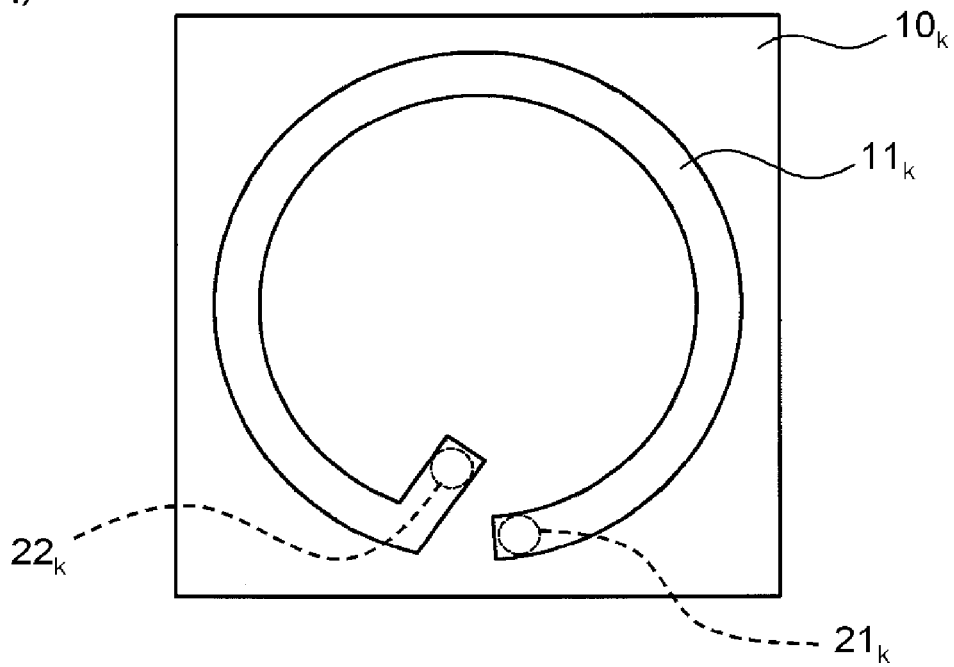
FIGS. 3(A) and (B) are plan views schematically illustrating exemplary interconnect patterns which compose a helical interconnect used for inductor or coil antenna.
Figure 3:
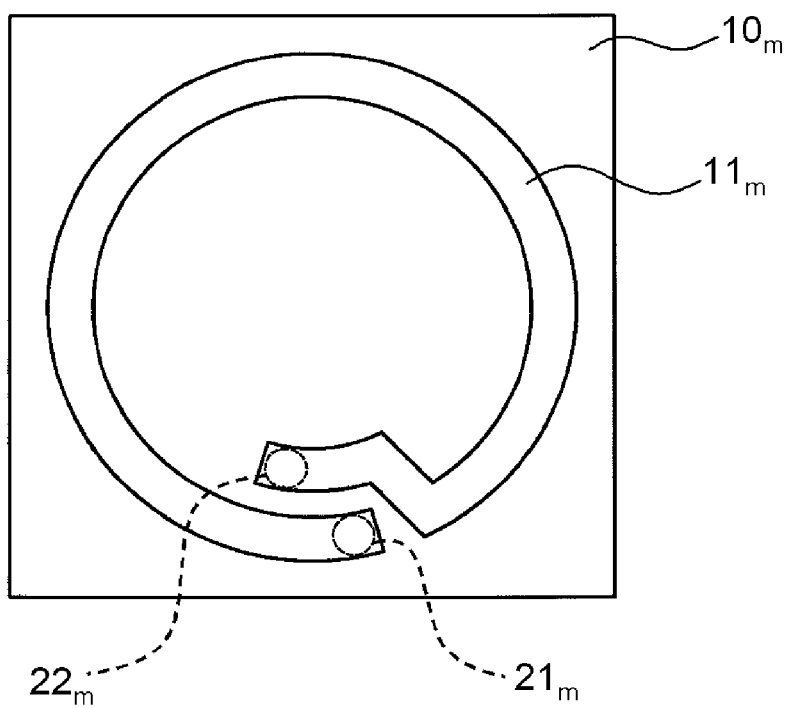

FIG. 3(A) and FIG. 3(B) are plan views illustrating the interconnect patterns $11_k$, $11_m$, on resin bases $10_k$, $10_m$ respectively, which compose a helical interconnect used for inductor or coil antenna. The helical interconnect may be configured by a combination of the interconnect pattern $11_k$ illustrated in FIG. 3(A) and the interconnect pattern $11_m$ illustrated in FIG. 3(B). The interconnect pattern $11_k$ illustrated in FIG. 3(A) is a spiral interconnect having bump connection points $21_k$, $22_k$ at the ends thereof, and has an angle of turn of approximately 360 degree. The interconnect pattern $11_m$ illustrated in FIG. 3(B) is a spiral interconnect having bump connection point $21_m$, $22_m$ at the ends thereof, and has an angle of turn exceeding 360°. While each of the interconnect patterns $11_k$, $11_m$ illustrated in FIG. 3 is given in a form of combination of curve(s) and a straight line, they may be configured by curve(s) only, or by straight line(s) only.

Note that "helical" herein means a geometry such as rotatively ascending or descending in the thickness-wise direction of the multilayer circuit board 1. On the other hand, "spiral" herein means a geometry such as turning while departing from, or approaching, the center axis in the plane of the multilayer circuit board 1.

The helical interconnect may be formed by connecting the bump connection point $22_k$ formed at one end of the interconnect pattern $11_k$ illustrated in FIG. 3(A), with the bump connection point $22_m$ formed at one end of the interconnect pattern $11_m$ illustrated in FIG. 3(B), through the electro-conductive bump. Alternatively, the helical interconnect may be formed by connecting the bump connection point $21_k$ formed at the other end of the interconnect pattern $11_k$ illustrated in FIG. 3(A), with the bump connection point $21_m$ formed at the other end of the interconnect pattern $11_m$ illustrated in FIG. 3(B), through the electro-conductive bump.

Figure 4:
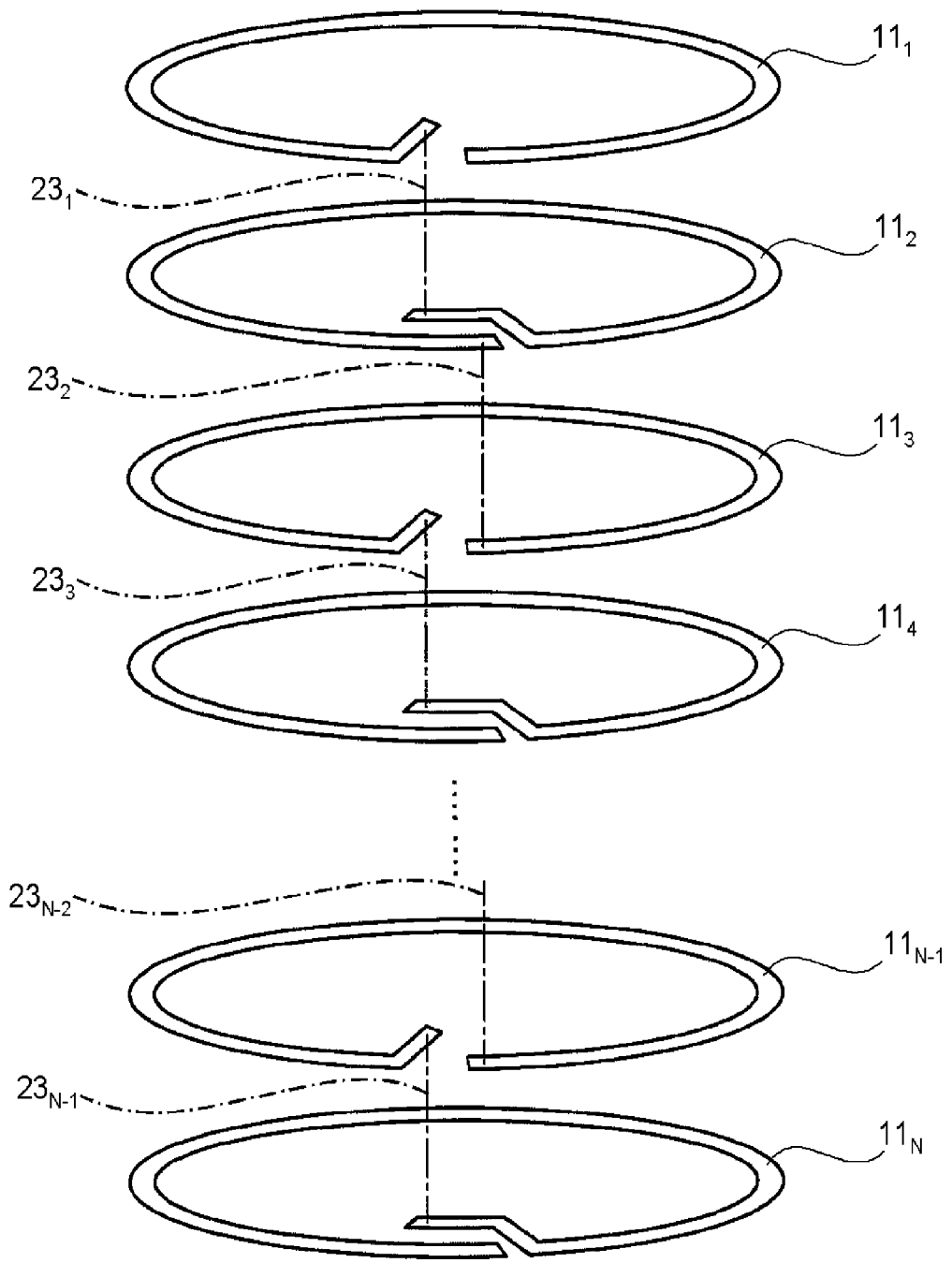
FIG. 4 is a schematic drawing illustrating a helical interconnect.

FIG. 4 is a schematic drawing illustrating a helical interconnect formed by using the interconnect patterns $11_k$, $11_m$ illustrated in FIGS. 3(A), (B). The interconnect patterns $11_1$, $11_3, \ldots, 11_{N-1}$ (where, N represents an even number) in the odd-th layers have a geometry same as that of the interconnect pattern $11_k$ illustrated in FIG. 3(A), whereas the interconnect patterns $11_2, 11_4, \ldots, 11_N$ in the even-th layers have a geometry same as that of the interconnect pattern $11_m$ illustrated in FIG. 3(B). The interconnect patterns $11_1$ to $11_N$ are electrically connected while respectively placing inter-layer connecting lines $23_1$ to $23_{N-1}$ configured by the electro-conductive bumps $20_1$ to $20_{N-1}$ in between.

Effects expressed by the multilayer circuit board 1 and the method of manufacturing the same according to the first embodiment are as follow.

In the process of manufacturing the multilayer circuit board 1, the resin bases $10_1$ to $10_N$ having the interconnect patterns $11_1$ to $11_N$ formed on the surfaces thereof are heat-bonded with the separators $12_1$ to $12_{N-1}$, at a temperature higher than the glass transition temperature Tg1 of the separators $12_1$ to $12_{N-1}$, and lower than the glass transition temperature Tg2 of the resin base $10_1$ to $10_N$, so that the thermoplastic resin composing the separator $12_1$ to $12_{N-1}$ may be melted or softened without melting nor softening the thermoplastic resin composing the resin bases $10_1$ to $10_N$. Since the separators $12_1$ to $12_{N-1}$ and the resin bases $10_1$ to $10_N$ are pressed under heating under such conditions, so that the electro-conductive bumps $20_1, \ldots, 20_{N-1}$, which are formed on the resin bases $10_1$ to $10_N$, kept unmelted and unsoftened, may be bonded to the surfaces of the interconnect patterns $11_2, \ldots, 11_N$, after being extended through the melted or softened separators $12_1, \ldots, 12_{N-1}$. In this way, geometrical modification of the interconnect patterns $11_1$ to $11_N$ in the process of heat bonding may be avoidable.

Accordingly, the present invention may successfully provide the multilayer circuit board 1 which has expressing excellent electrical characteristics (small dielectric constant and small dielectric loss) in high-frequency range, and includes the interconnect patterns $11_1$ to $11_N$ capable of ensuring a good geometrical accuracy.

The interconnect patterns $11_2, 11_4, \ldots, 11_N$ in the even-th layers have an angle of turn exceeding 360°, while giving an almost circular geometry in portions thereof opposed to the interconnect patterns $11_1, 11_3, \ldots, 11_{N-1}$ in the odd-th layers configured on the upper and lower sides thereof. If the angle of turn of the interconnect patterns $11_1$ to $11_N$ were smaller than 360°, the number of turns would be reduced corresponding to the angle of turn which comes short of 360°, and thereby inductance of the helical interconnect would decrease. In other words, the helical interconnect in this embodiment may be formed without degrading the inductance.

(Second Embodiment)

Figure 5:
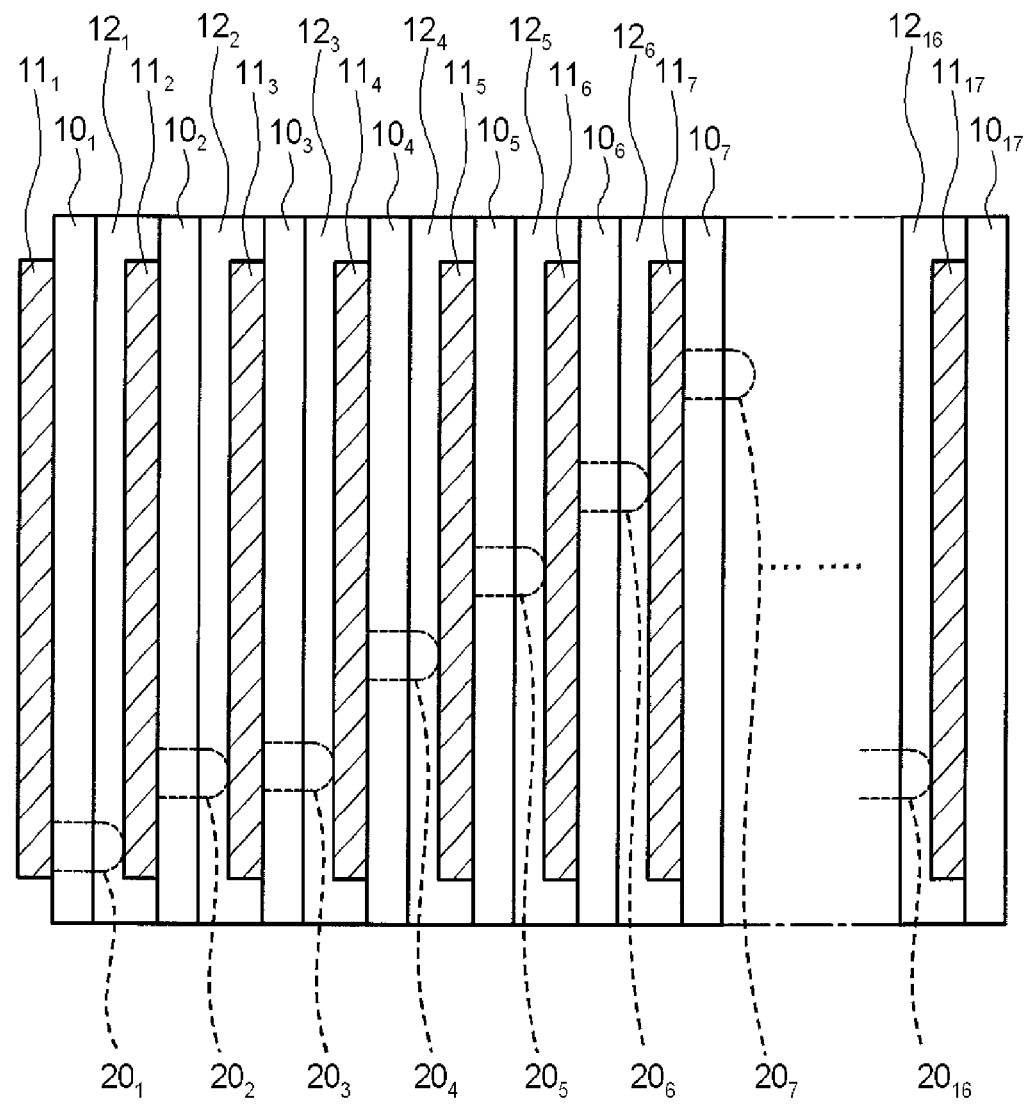
FIG. 5 is a drawing schematically illustrating a stacked structure of the multilayer circuit board according to a second embodiment of the present invention.
Figure 6:
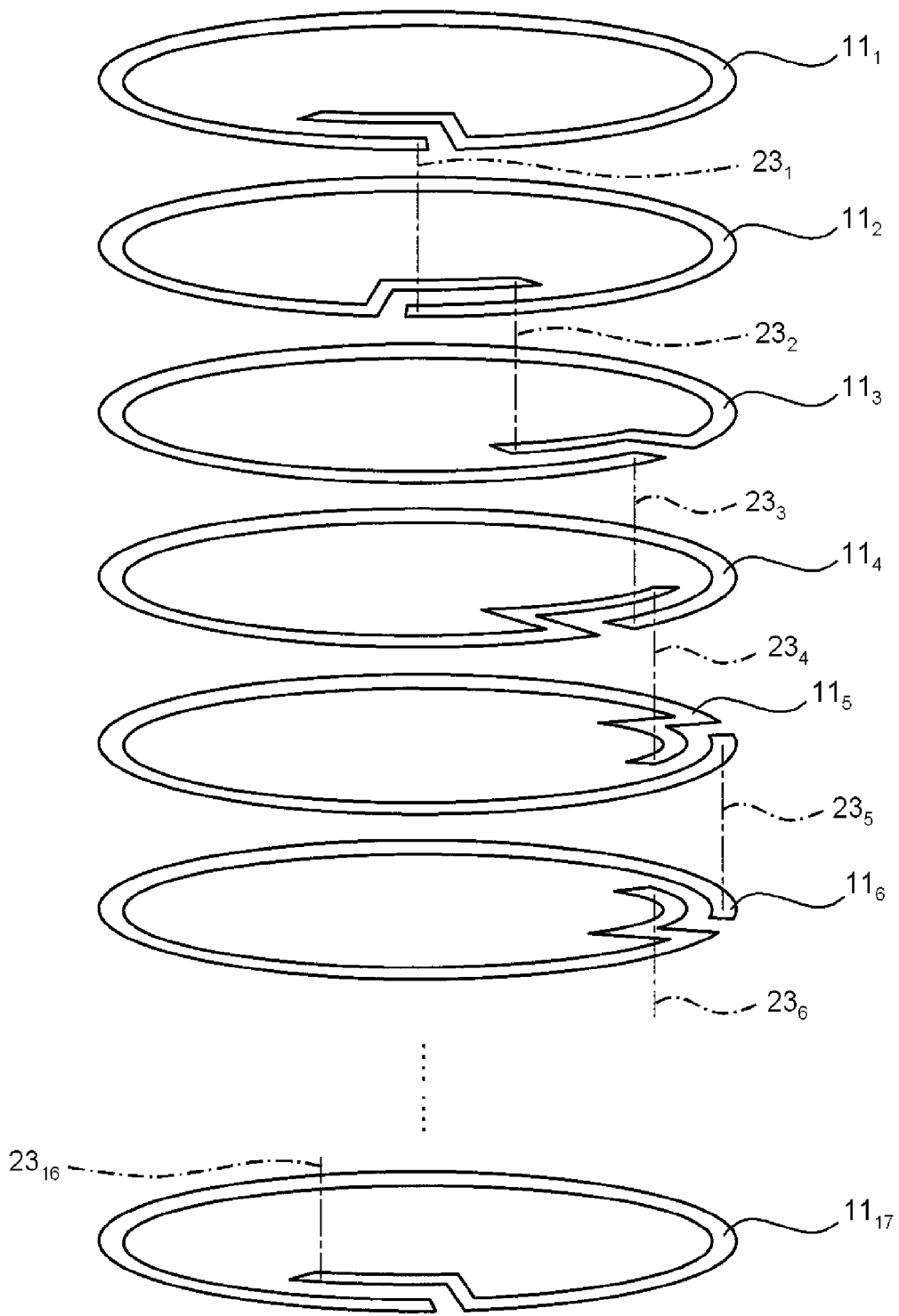
FIG. 6 is a schematic drawing illustrating an exemplary interconnect pattern of the second embodiment.

Next, the second embodiment of the present invention will be explained. FIG. 5 is a drawing schematically illustrating a stacked structure of a multilayer circuit board 2 of the second embodiment. FIG. 6 is a schematic drawing illustrating exemplary interconnect patterns $11_1$ to $11_{17}$ which compose a helical interconnect formed in the multilayer circuit board 2. The multilayer circuit board 2 of the second embodiment has a configuration same as that of the multilayer circuit board 1 of the first embodiment, except for positions of the electro-conductive bumps $20_1$ to $20_{16}$ and geometry of the interconnect patterns $11_1$ to $11_{17}$, and may be manufactured by processes same as those for the multilayer circuit board 1 of the first embodiment.

Each of the interconnect patterns $11_1$ to $11_{17}$ is a spiral interconnect pattern having an angle of turn exceeding 360°. The interconnect patterns $11_1, 11_3, \ldots, 11_{17}$ formed on the resin bases $10_1, 10_3, \ldots, 10_{17}$ in the odd-th layers, and the interconnect patterns $11_2, 11_4, \ldots, 11_{16}$ formed on the resin bases $10_2, 10_4, \ldots, 10_{16}$ in the even-th layers have geometries turned over from the other. In other words, since the resin bases $10_1, 10_3, \ldots, 10_{17}$ and the resin bases $10_2, 10_4, \ldots, 10_{16}$ are alternately disposed, the interconnect patterns $11_1$ to $11_{17}$ are alternately stacked face-up and face-down. Of course, the interconnect patterns $11_1$ to $11_{17}$ are connected at both ends thereof through the electro-conductive bumps.

In the first embodiment, as illustrated in FIG. 1 and FIG. 4, the electro-conductive bumps $20_1, 20_3, \ldots, 20_{N-1}$ (where, N represents an even number) in the odd-th layers were formed at positions which overlap with each other when viewed in the direction of stacking, and also the electro-conductive bumps $20_2, 20_4, \ldots, 20_{N-2}$ in the even-th layers were formed at positions which overlap with each other when viewed in the direction of stacking. As a consequence, the multilayer structure of the first embodiment may result in non-uniform thickness, depending on types of the thermoplastic resin adopted or conditions of heating or pressing.

In contrast, according to the second embodiment, since the interconnect patterns $11_1$ to $11_{17}$ are alternately stacked face-up and face-down, so that positions of formation of the electro-conductive bumps $20_1$ to $20_{16}$ do not overlap when viewed in the direction of stacking. Since there are sixteen resin bases $10_1$ to $10_{16}$ having the electro-conductive bumps $20_1$ to $20_{16}$ embedded therein, so that the inter-layer connecting lines $23_1$ to $23_{16}$ may be arranged at regular angular intervals around the center axis of the interconnect patterns $11_1$ to $11_{17}$, by forming the interconnect patterns $11_1$ to $11_{17}$ while adjusting the angle of turn thereof to (360°+360°/16). More specifically, as illustrated in FIG. 6, the interconnect patterns $11_1$ to $11_{17}$ are electrically connected through the inter-layer connecting lines $23_1$ to $23_{16}$ formed by the electro-conductive bumps $20_1$ to $20_{16}$. The inter-layer connecting lines $23_1$ to $23_{16}$ are arranged at an angular interval of approximately 22.5° around the center axis of the interconnect pattern $11_1$ to $11_{17}$.

As explained in the above, since the electro-conductive bumps $20_1$ to $20_{16}$ of the multilayer circuit board 2 of the second embodiment are formed at positions not overlapped when viewed in the direction of stacking, so that the non-uniformity in the thickness may be avoidable. Accordingly, the multilayer circuit board 2 may be improved in the rigidity balance, and consequently in the strength thereof.

While the number of the layers in the multilayer circuit board 2 of the second embodiment was seventeen, the number is not limited thereto, so that the multilayer circuit boards 2 may be modified to have eighteen or more layers. For an exemplary case where the number of the layers in the multilayer circuit board 2 is N, the number of the resin bases 10 having the electro-conductive bumps 20 embedded therein is N-1, so that the inter-layer connecting lines 23 may be arranged at regular angular intervals around the center axis of the interconnect patterns 11, by forming the interconnect patterns 11 while adjusting the angle of turn thereof to (360°+360°/(N-1)).

Figure 7:
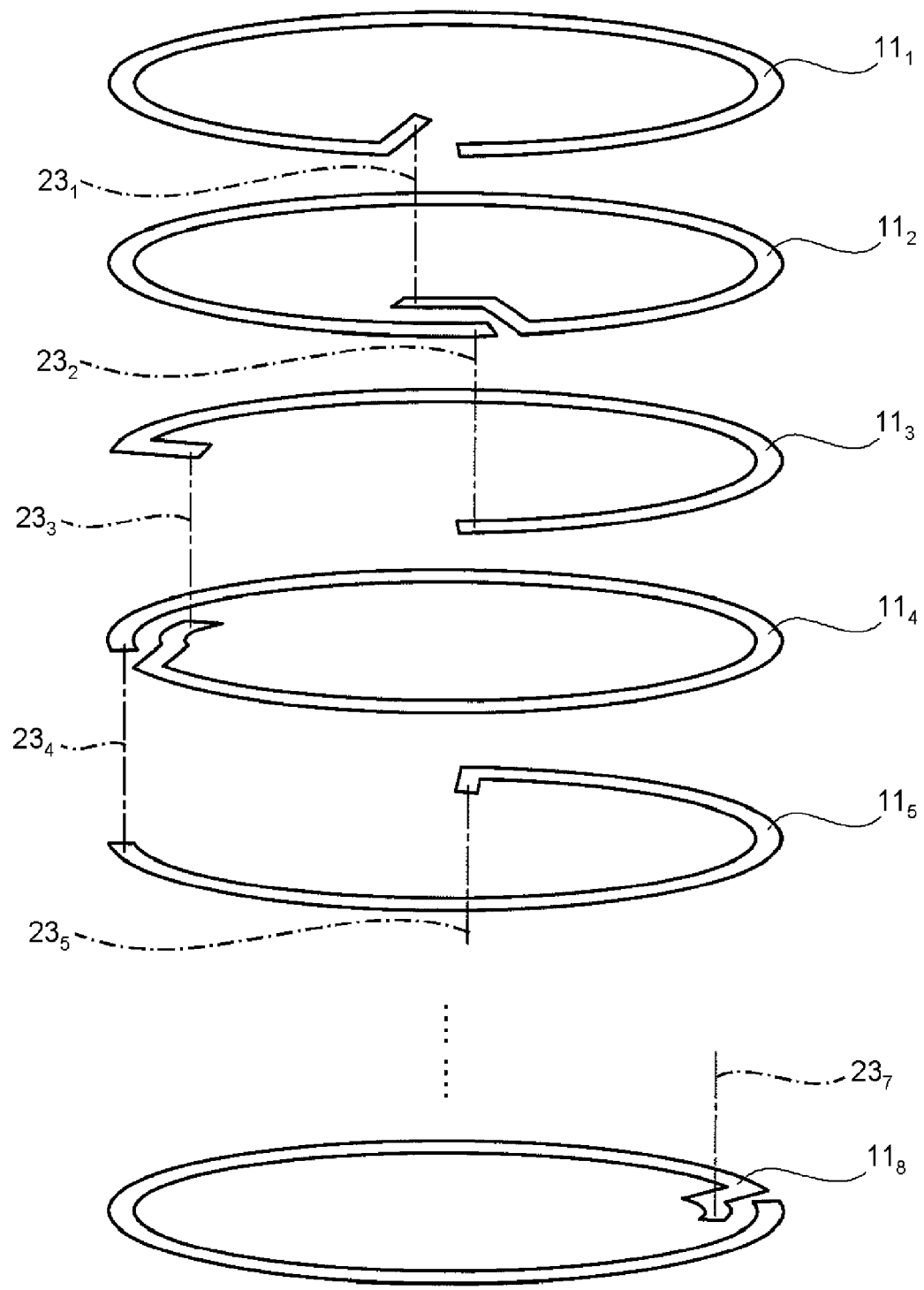
FIG. 7 is a schematic drawing illustrating an exemplary interconnect pattern according to a modified example of the second embodiment.

One modified example of the second embodiment may possibly be given by a multilayer circuit board having a helical interconnect as illustrated in FIG. 7. As is clear from FIG. 7, the odd-th inter-layer connecting lines $23_1, 23_3, 23_5, 23_7$ are formed so as to be arranged at an angular interval of approximately 45° around the center axis of the interconnect patterns $11_1$ to $11_8$, and the even-th inter-layer connecting lines $23_2, 23_4, 23_6$ are formed so as to be arranged at regular angular intervals around the center axis of the interconnect patterns $11_1$ to $11_8$.

The embodiments of the present invention were described in the above referring to the attached drawings merely for exemplary purposes, while allowing adoption of various configurations other than those described in the above. For example, while the first and second embodiments dealt with the cases having six or more layers of interconnect patterns, the present invention is not limited thereto. An embodiment of the multilayer circuit board having at least two layers of the interconnect patterns may possibly be given as a modified example of the first embodiment, and an embodiment of the multilayer circuit board having at least two layers of the interconnect patterns may possibly be given as a modified example of the second embodiment.

An inductor may be embodied by a plurality of spiral interconnect patterns connected in a helical manner as illustrated in FIG. 4 and FIG. 6, where the geometry of the interconnect patterns is not limited thereto. The geometry may alternatively be arc-like, square-like or polygonal.

Moreover, the multilayer circuit board of the present invention may be provided with layers other than those composing the above-described interconnect patterns, resin bases and separators, without contradicting the features of the present invention.

This application claims priority right based on Japanese Patent Application No. 2008-279732 filed on Oct. 30, 2008, the entire content of which is incorporated hereinto by reference.

The invention claimed is:

1. A multilayer circuit board comprising:
    a plurality of resin bases stacked while respectively placing a separator in between;
    a plurality of interconnect patterns formed on one surface of each of said plurality of resin bases, each of the plurality of interconnect patterns having a curved shape with a first pattern of the plurality of interconnect patterns being formed on a first one of the resin bases and a second pattern of the plurality of interconnect patterns being formed on a second one of the resin bases, the first pattern having a first connecting end and a second connecting end, the second pattern having a third connecting end and a fourth connecting end; and electro-conductive bumps which are formed to extend through said resin bases and said separators, so as to electrically connect said plurality of interconnect patterns such that a first electro-conductive bump electrically connects the second connecting end to the third connecting end, with the fourth connecting end overlaying the first connecting end but being spaced apart from the first connecting end by the separator in between, the first pattern and the second pattern forming a helix as a whole through the first electro-conductive bump, said resin bases and said separators being heat-bonded, said separators being composed of a first thermoplastic resin material having a first glass transition temperature, and each of said resin bases being composed of a second thermoplastic resin material having a second glass transition temperature higher than said first glass transition temperature.

2. The multilayer circuit board as claimed in claim 1, wherein the first electro-conductive bump is formed to protrude from the third connecting end of the second pattern of said plurality of interconnect patterns, towards the third connecting end of the second pattern.

3. The multilayer circuit board as claimed in claim 1, wherein said first and second thermoplastic resin materials are respectively configured by cyclic olefinic resin compositions having different glass transition temperatures, as their major constituents.

4. The multilayer circuit board as claimed in claim 3, wherein said cyclic olefinic resin composition is a norbornene resin.

5. The multilayer circuit board as claimed in claim 1, wherein said electro-conductive bumps are composed of one or more species of metal materials selected from the group consisting of gold, silver, nickel, tin, lead, zinc, bismuth, antimony and copper.

6. The multilayer circuit board as claimed in claim 1, wherein said plurality of interconnect patterns and said electro-conductive bumps configure a passive element.

7. The multilayer circuit board as claimed in claim 6, wherein said passive element contains any one of, or a plurality of, circuit(s) selected from resistor, inductor and capacitor.

8. The multilayer circuit board as claimed in claim 1, further comprising a third pattern of the plurality of interconnect patterns being formed on a third one of the resin bases, the third pattern having a fifth connecting end and a sixth connecting end, a second electro-conductive bump electrically connects the fourth connecting end to the fifth connecting end, and the first and second electro-conductive bumps are formed at different positions when viewed in the direction of stacking.

9. The multilayer circuit board as claimed in claim 8, wherein each of the first pattern, the second pattern and the third pattern defines a spiral interconnect pattern having an angle of turn exceeding 360°.

10. The multilayer circuit board as claimed in claim 9, wherein the spiral interconnect patterns are stacked alternately upside-down, with the individual ends thereof connected to each other through said electro-conductive bumps.

11. The multilayer circuit board as claimed in claim 10, wherein the number of said resin bases having said electro-conductive bumps buried therein is M (M is a natural number), and the angle of turn of said spiral interconnect pattern is (360°+360°/M).

12. The multilayer circuit board as claimed in claim 8, further comprising
a fourth pattern of the plurality of interconnect patterns being formed on a fourth one of the resin bases, the fourth pattern having a seventh connecting end and an eighth connecting end, a third electro-conductive bump electrically connects the sixth connecting end to the seventh connecting end.

* * * * *